United States Patent [19]
Davenport

[11] Patent Number: 6,103,069
[45] Date of Patent: Aug. 15, 2000

[54] CHAMBER DESIGN WITH ISOLATION VALVE TO PRESERVE VACUUM DURING MAINTENANCE

[75] Inventor: Robert E. Davenport, San Jose, Calif.

[73] Assignee: Applied Materials, Inc., Santa Clara, Calif.

[21] Appl. No.: 08/828,250

[22] Filed: Mar. 31, 1997

[51] Int. Cl.[7] .................................................. C23C 14/34
[52] U.S. Cl. ............................ 204/192.12; 204/298.07; 204/298.11; 204/298.23; 204/298.25
[58] Field of Search ...................... 204/298.01, 298.15, 204/298.22, 298.23, 298.25, 298.07, 298.11, 298.12, 298.14, 298.26, 192.12

[56] References Cited

U.S. PATENT DOCUMENTS

| | | | |
|---|---|---|---|
| 3,206,322 | 9/1965 | Morgan | 438/460 |
| 3,641,973 | 2/1972 | Shrader | 118/719 |
| 3,921,572 | 11/1975 | Brunner et al. | 118/730 |
| 4,294,678 | 10/1981 | Kuehnle | 204/192.12 |
| 4,338,883 | 7/1982 | Mahler | 118/719 |
| 4,519,885 | 5/1985 | Innis | 204/192.12 |
| 5,065,698 | 11/1991 | Koike | 118/719 |
| 5,112,185 | 5/1992 | Koike | 414/805 |
| 5,223,112 | 6/1993 | Tepman | 204/298.11 |
| 5,372,693 | 12/1994 | Bräuer et al. | 204/298.11 |
| 5,380,414 | 1/1995 | Tepman | 204/192.3 |
| 5,429,729 | 7/1995 | Kamei et al. | 204/192.12 |
| 5,571,331 | 11/1996 | Schertler et al. | 118/719 |
| 5,624,536 | 4/1997 | Wada et al. | 204/298.25 |

FOREIGN PATENT DOCUMENTS

| | | |
|---|---|---|
| 0 421 498 A2 | 7/1990 | European Pat. Off. . |
| 0 492 114 A1 | 11/1991 | Germany . |
| 60-262969 | 12/1985 | Japan . |

OTHER PUBLICATIONS

Communication Dated Oct. 31, 1998 and Austrian Search Report.
Communication Dated Jul. 20, 1998 and European Search Report.
Annex to the European Search Report on European No. EP 98 30 2504.

Primary Examiner—Rodney McDonald
Attorney, Agent, or Firm—Thomason, Moser and Patterson

[57] ABSTRACT

The present invention provides a vacuum chamber that reduces the amount of time required to draw a vacuum after replacing consumables or performing routine maintenance by preserving the vacuum in a portion of the chamber. More particularly, the chamber isolates a frequently replaced consumable or component in a first portion of the chamber so that only the first portion of the chamber is exposed to the surrounding environment and the volume of gas or air that must be re-evacuated is reduced. A gate valve is provided to form a seal with a valve seat that is either formed into the chamber wall or provided by a valve body. Once the second portion is sealed, a lid to the first portion may be opened for access.

13 Claims, 8 Drawing Sheets

CHAMBER DESIGN WITH ISOLATION VALVE TO PRESERVE VACUUM DURING MAINTENANCE

BACKGROUND OF THE INVENTION

1. Field of the Invention

The present invention relates to a vacuum processing chamber having an isolation valve for preserving a vacuum in one portion of a chamber while allowing maintenance or other access to another portion of the chamber. More particularly, the invention relates to a gate valve that can preserve a vacuum in a portion of a chamber in order to reduce the amount of time necessary to pump down the chamber after maintenance in another portion of the chamber.

2. Background of the Related Art

Vacuum chambers have been used to advantage in many different processes in many different industries. The vacuum conditions and the purpose of the vacuum can vary widely from one process or chamber to another. In many applications, the vacuum chamber will work in cooperation with or actually contain certain equipment or members that will further alter the conditions in the chamber or perform some operation within the chamber. Furthermore, the vacuum chamber will typically contain a workpiece that is being conditioned by the chamber environment or processed by equipment within the chamber. In either case, it is frequently necessary or desirable to replace the workpiece or certain pieces of equipment in the chamber. However, opening the chamber to the surrounding environment eliminates the vacuum, disturbs other conditions in the chamber, allows escape of gaseous components and allows entrance of contaminants.

In order to reestablish a vacuum in the chamber, a variety of pumps, singularly or in combination, may be used according to the specific application to withdraw gases from the chamber. As will be recognized, pumps may be designed to operate over a range of gas flow rates and to achieve a range of pressures. For example, centrifugal pumps are typically used in applications where a high gas flow rate and only a small vacuum pressure is desired. On the other hand, cryogenic pumps are most commonly used in applications where a low flow rate is sufficient and a strong vacuum is desired.

Regardless of the specific application or the type of pump in use, it should be recognized that a significant amount of time and energy can be required to draw a vacuum in the chamber. Typically, the amount of time and energy that is expended ranges from about 5 to about 24 hours and represents a significant loss of productivity and efficiency. Therefore, much research effort has been devoted to increasing the productivity and efficiency of vacuum chambers and the processes that are performed within them. The results of these efforts have taken a number of different directions. For example, in high vacuum applications, such as integrated circuit fabrication, a roughing pump can be used to draw a vacuum on the order of about $10^{-3}$ torr followed by a cryogenic pump to establish a high vacuum on the order of about $10^{-7}$ to about $10^{-9}$ torr. In this manner, the strengths of each pump are utilized to minimize pump time. Another example involves efforts at increasing the reliability and life of equipment within the chamber to extend the frequency in which the chamber must be opened.

Figure 1:
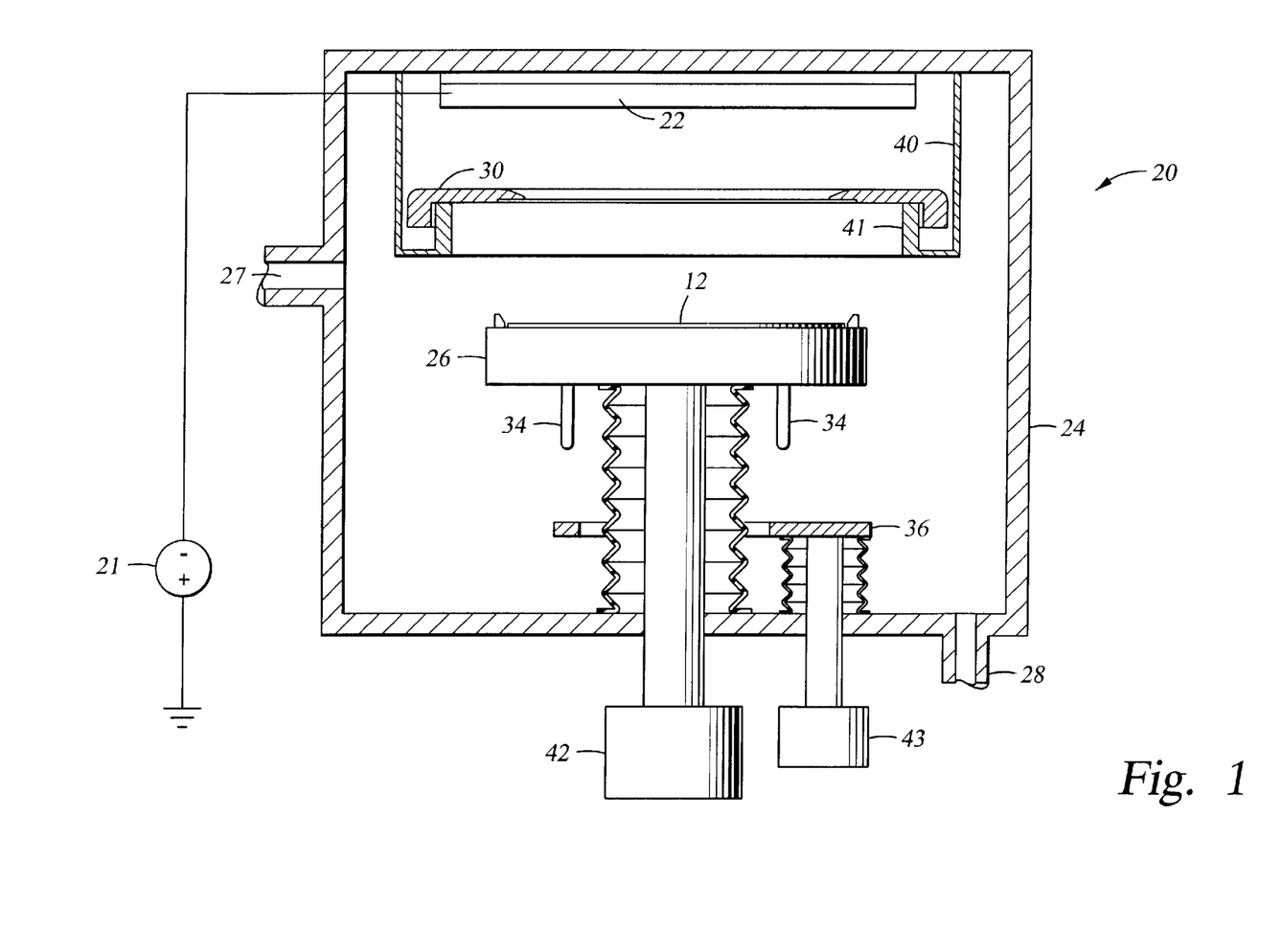
FIG. 1 is a cross-sectional view of a conventional physical vapor deposition chamber.

Typical vacuum processes used in the fabrication of integrated circuits include physical vapor deposition ("PVD") and chemical vapor deposition ("CVD"). A simplified sectional view of a typical vacuum chamber for physical vapor deposition of metal onto a substrate or workpiece is shown in FIG. 1. The chamber 20 generally includes a chamber enclosure wall 24, having at least one gas inlet 27 and an exhaust outlet 28 connected to an exhaust pump (not shown). A substrate support member 26 is disposed at the lower end of the chamber 20, and a target 22 is received at the upper end of the chamber 20. The target 22 is electrically isolated from the enclosure wall 24 and the enclosure wall is preferably grounded, so that a negative voltage may be maintained on the target 22 with respect to the grounded enclosure wall. A shield 40 may be disposed within the chamber, and may include an annular, upturned wall 41 on which a clamp ring 30 may be suspended over the support member 26 when the support member is retracted downwardly in the chamber.

In preparation for receiving a new semiconductor substrate into the chamber 20, the substrate support member 26 is lowered by a drive mechanism 42 well below the clamp ring and shield, so that the bottom of the support member is close to a pin positioning platform 36. The support member 26 includes three or more vertical bores (not shown), each of which contains a vertically slidable pin 34. When the support member is in the lowered position just described, the bottom tip of each pin rests on the platform 36, and the upper tip of each pin protrudes above the upper surface of the support member. The upper tips of the pins define a plane parallel to the upper surface of the support member for receipt of a substrate thereon.

A conventional robot arm (not shown) carries a substrate 12 into the chamber 20 and places the substrate above the upper tips (not shown) of the pins 34. A lift mechanism 43 moves the pin platform upwardly, to place the upper tips of the pins against the under side of the substrate and additionally lift the substrate off the robot blade. The robot blade then retracts from the chamber 20, and the lift mechanism raises the support member so that the pins slide down in the support member 26, thereby lowering the substrate onto the top of the support member.

The lift mechanism 42 may continue to raise the support member 26 so that the periphery of the substrate contacts the clamp ring 30 resting on the upturned wall portion 41. The inner diameter of the clamp ring is typically sized slightly smaller than the inner diameter of the substrate to shield the edge of the substrate. The support member may continue moving upwardly to position the substrate a set distance from the target surface.

In the case of the exemplary sputtering chamber 20 shown in FIG. 1, the deposition process is initiated by supplying a sputtering process gas (typically argon) to the chamber through the gas inlet 27, and applying a negative voltage from a DC power supply 21 to the sputtering target 22. The voltage excites the argon gas into a plasma state, causing the argon ions to bombard the negatively biased target to sputter material off the target. The sputtered material then deposits on the substrate, except for a portion of the material which is deposited on the shield, clamp ring, or other internal surfaces or components of the chamber. After the film layer has been deposited on the substrate, the substrate is removed from the chamber 20 by reversing the sequence of steps by which it was carried into the chamber.

While certain improvements in the chamber design and chamber consumables, such as the target 22, have increased the productivity and efficiency of vacuum chambers, further improvements are desired. Therefore, there remains a need for a vacuum chamber that reduces the amount of time required to draw a vacuum after replacing consumables or performance of routine maintenance. It would be desirable if the chamber could preserve the vacuum in the chamber. More particularly, it would be desirable to have a chamber that isolates a frequently replaced consumable or component from the rest of the chamber so that only a minimal portion of the chamber is exposed to the surrounding environment and the volume of space that must be evacuated is minimized.

SUMMARY OF THE INVENTION

The present invention provides a physical vapor deposition chamber comprising an enclosure having a first portion containing a replaceable member, a second portion containing a workpiece support member and a vacuum port, and a valve seat along the inner wall of the enclosure between the first and second portions. The enclosure incorporates an isolation valve having a housing, an isolation plate, and an actuator for displacing the isolation plate between a position fully retracted into the housing and a position fully extended into the enclosure to sealingly engage the valve seat and form a vacuum tight seal with the second portion of the enclosure.

Another aspect of the invention provides an apparatus for maintaining a vacuum in a first portion of a physical vapor deposition chamber during replacement of a replaceable member in a second portion of the chamber. This apparatus comprises a secondary valve coupled to a port in the chamber, wherein the secondary valve can be closed to form a vacuum tight seal with the chamber. The isolation valve described above may then be detachably coupled to the secondary valve The invention also provides a semiconductor manufacturing system, comprising a plurality of process enclosures having a first portion containing a process kit, a second portion containing a workpiece support member and a vacuum port, an isolation valve seat along the inner wall of the enclosure between the first and second portions, an isolation valve port along one portion of the isolation valve seat, and a secondary valve positioned over the isolation valve port. The secondary valve can form a vacuum tight seal between the enclosure and the isolation plate storage cavity when the isolation plate is not extended therethrough. In this manner, the isolation valve can be interchangeably coupled to a plurality of the enclosures, such as physical vapor deposition chambers.

The invention further provides a method of replacing a process kit in a vacuum chamber. The method includes closing a vacuum tight valve to isolate a first portion of the chamber containing the process kit from a major portion of the chamber while under a vacuum. The vacuum in the first portion of the chamber is then relieved before opening a lid to the first portion of the chamber. The previous process kit from the first portion of the chamber is replaced with a new process kit and the lid to the first portion of the chamber is closed. A vacuum is then drawn in the first portion of the chamber before opening the isolation valve.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefor not to be considered limiting of its scope, for the invention may admit to other equally effective embodiments.

DETAILED DESCRIPTION OF A PREFERRED EMBODIMENT

The present invention provides a vacuum chamber that reduces the amount of time required to draw a vacuum after replacing consumables or performing routine maintenance by preserving the vacuum in a portion of the chamber. More particularly, the chamber isolates a frequently replaced consumable or component in a first portion of the chamber so that only the first portion of the chamber is exposed to the surrounding environment and the volume of gas or air that must be re-evacuated is reduced.

The vacuum chamber of the present invention comprises an enclosure having a first portion containing a replaceable member or other member requiring maintenance and a second portion containing other chamber components, members or workpieces. A valve seat is formed in the inner wall of the enclosure or a valve body and defines the interface between the first and second portions. The first portion has a lid or door that is specifically designed for access to the replaceable member or, alternatively, a general access way or opening for access to any number of items.

In one aspect of the invention, an isolation valve is coupled to a valve port on the enclosure for controllable engagement with the valve seat on the inner wall of the enclosure. The valve has a vacuum-tight housing enclosing a rigid isolation plate having a profile that mates with the valve seat to form a vacuum-tight seal between the two portions of the chamber. An actuator is provided with the valve for urging and displacing the isolation plate between a position fully retracted into the housing and a position fully extended into the enclosure to sealingly engage the valve seat.

In another aspect of the invention, a secondary isolation valve is interposed between the chamber valve port and the isolation valve. The secondary isolation valve is designed to seal the chamber valve port when the isolation valve is not in use, thereby shielding the isolation valve from deposition and also allowing the isolation valve to be removed from the chamber for maintenance or possibly for use in cooperation with multiple chambers similarly equipped.

In yet another aspect of the invention, the isolation valve seat may be machined into the interior side wall of the chamber (as shown in FIGS. 2–7) or provided as a separate member mounted between the first and second portions of the chamber. Additionally, the valve seat may be provides as part of an integral valve and valve seat that is similarly mounted between the first and second portions of the chamber.

In a further aspect of the invention, the isolation valve may have an anode formed on the side facing the isolated portion of the chamber and allow that portion of the chamber to be cleaned by a plasma during the same time period that the target is being replace in the first portion of the chamber. Furthermore, a second isolation valve may be disposed immediately above the workpiece support member 57 to protect the support member 57 or any electrostatic chuck formed thereon during the plasma cleaning process.

Figure 2:
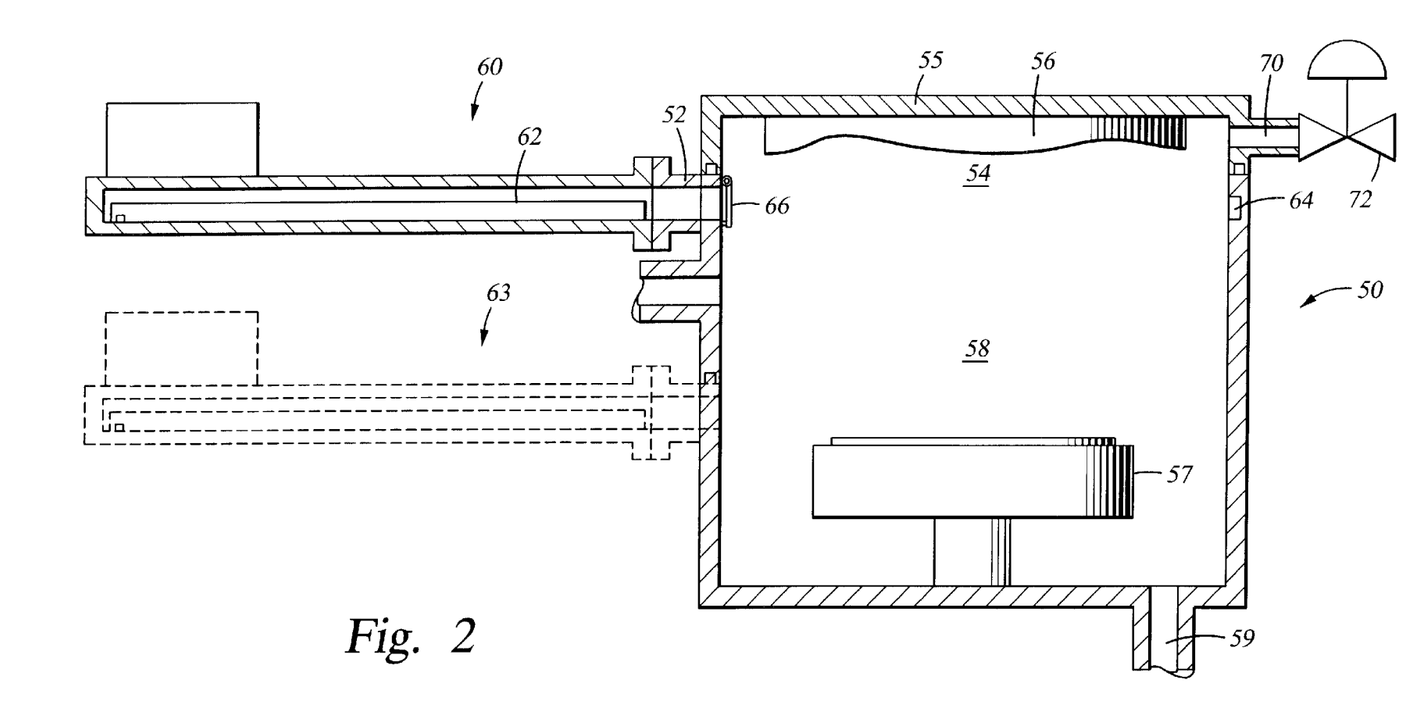
FIGS. 2–6 are simplified cross-sectional views of the PVD chamber of FIG. 1 having an isolation valve attached to a valve port of the chamber.

Now referring to FIG. 2, a simplified cross-sectional view of a PVD chamber 50 is shown having an isolation valve 60 attached to a valve port 52 of the chamber. Where the vacuum chamber is a PVD chamber, it is preferred that the first portion 54 contain a process kit or sputter target 56 and that the second portion 58 include a workpiece support member 57 and a vacuum port 59. The isolation valve 60 of the present invention reduces the amount of time required to re-establish a vacuum in the PVD chamber 50 by maintaining the vacuum in the second portion 58 during routine operations in the first portion 54. By positioning the valve port 52 immediately adjacent the replaceable members, whether these members include an entire process kit or simply a sputter target 56, the vacuum in the remaining second portion 58 of the chamber 50 is preserved. Therefore, the volume of gas that enters the chamber is no greater than the gas-containing volume of the first portion 54, and only this portion of the chamber must be re-evacuated. Once the lid 55 to the first portion 54 has been opened and the member(s) have been replaced, then the door or lid 55 is resealed to the chamber 50 and only this first portion of the chamber must be evacuated. It is preferred that the volume of the first portion 54 be minimized and that the second portion 58 of the enclosure be a major portion of the total gas-containing volume of the chamber. Additionally, the first portion 54 may be sized to include all consumables used in the process, in the case of sputter deposition the target and shields, or, only a portion of the consumables, such as just the target. Further, where the life of the various consumables is different, multiple valves may be used to isolate multiple portions of the chamber, enabling replacement of different consumable components at different schedules without breaking vacuum to the remainder of the chambers or remaining consumables.

The first portion 54 of the chamber 50 must have a vacuum release therein so that the door or lid may be opened. The preferred vacuum release is a gas port 70 and a vacuum controller or valve 72 for relieving the vacuum in order to open the lid 55 and access the replaceable member 56. Furtheremore, the chamber 50 may optionally include a second isolation valve 63 or other shutter valve disposed for isolating the workpiece support member 57 during plasma cleaning. This second isolation valve 63 may be particularly useful in combination with a first isolation valve 60 having a plate 62 that is biased (See FIG. 8).

Figure 3:
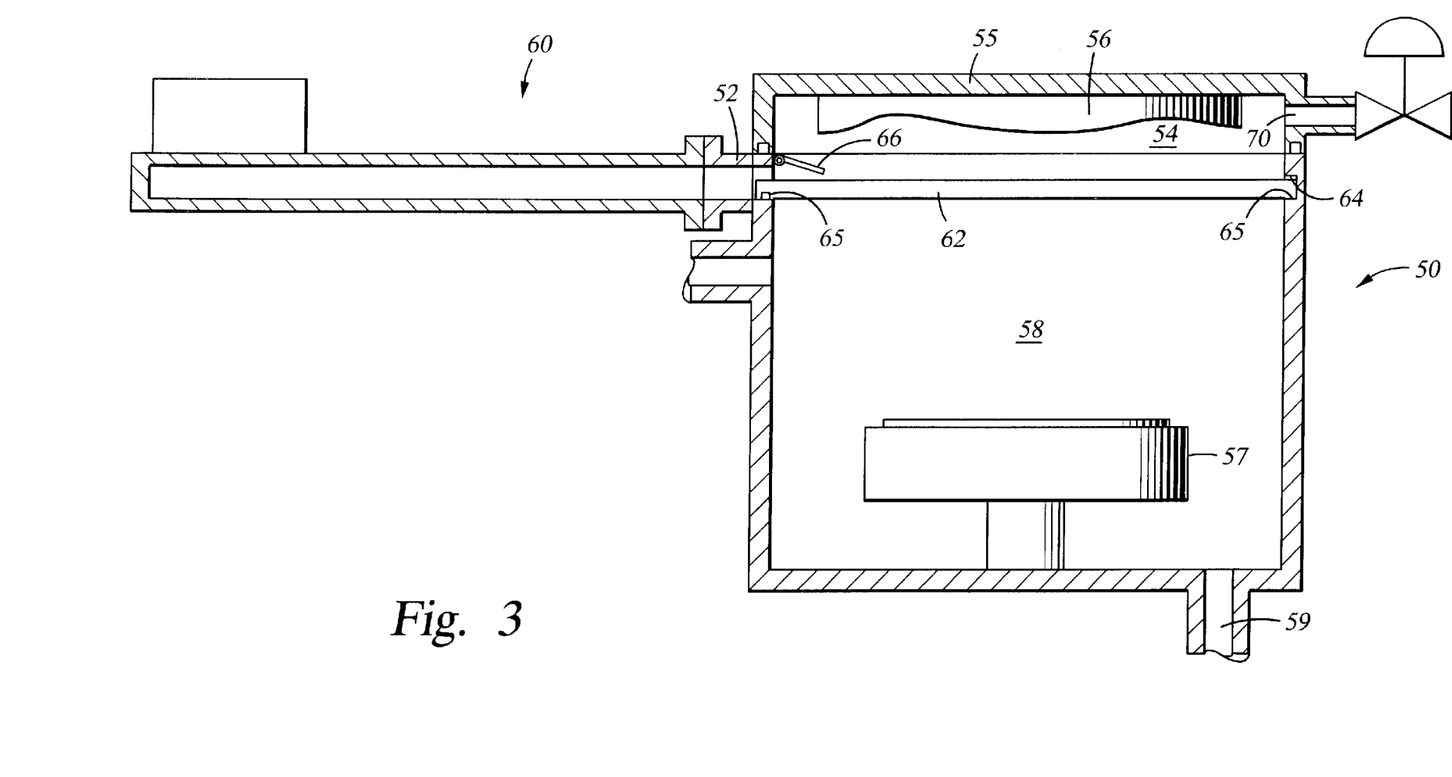

Now referring to FIG. 3, a simplified cross-sectional view of the PVD chamber 50 of FIG. 2 is shown having the isolation valve 60 with plate 62 extended into the chamber to sealingly engage with the valve seat 64 on the inner walls of the chamber 50. The edge of the plate 62 facing the vacuum isolated portion 58 will preferably have an o-ring 65 secured therein. With the isolation plate 62 in this position, the vacuum in the lower portion 58 can be maintained while the vacuum in the upper portion 54 is relieved by opening the vacuum controller 72 and allowing a gas to enter through gas port 70.

Figure 8:
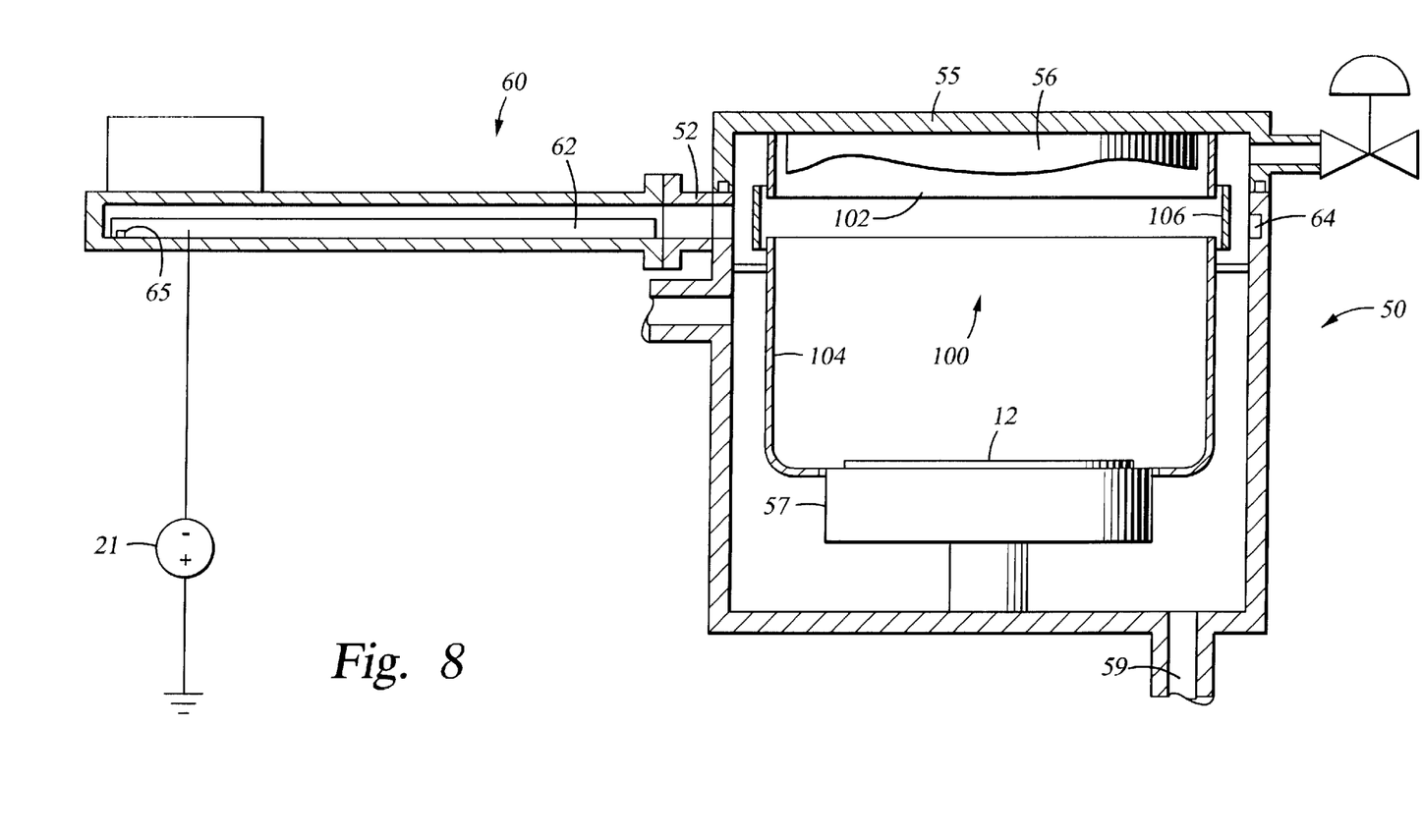
FIG. 8 is a simplified cross-sectional view of an alternative embodiment of a chamber and valve assembly of the present invention having a DC power supply coupled to the valve plate.

Note that in FIG. 3 the valve port shield 66 has been pushed up and out of the path of the isolation valve plate 62. While the valve port shield may take many different forms, it is shown in FIG. 3 as a hinged flap or multiple hinged flaps. Referring to FIG. 8, the chamber 50 is shown with a sputter shield assembly 100 that would protect the valve port 52 from deposits. The assembly 100 is preferably cylindrical to cooperate with the circular substrate 12 and substrate support member 57 and prevent excessive deposition throughout the chamber 50 and on the valve port 52. The upper and lower shield members 102, 104 are preferably coupled to the lid 55 and chamber 50 sidewalls, respectively, so that they are fixed in place a spaced distance apart to define a slot sufficient for passage of the isolation plate 62. A moveable shield member 106 is concentrically positioned adjacent the shield members 102, 104 to cover the slot formed between the upper and lower shield members 102, 104. Moveable member 106 may be actuated to open the slot by any mechanical, electrical or magnetic means.

Still referring to FIG. 8, another aspect of the invention provides a DC power supply coupled to the valve plate 62. When the valve plate is in the closed position (see FIGS. 3 and 4), the valve plate 62 can be electrically biased to allow a reactive etch of the chamber sputter shield assembly 100 in order to remove deposited material and clean the shields for continued use. One of the primary benefits of performing the etch with a biased valve plate 62 is that the target 56 will be protected from the harsh etch environment. It is also preferred to use a shutter mechanism, such as the isolation valve 63 in FIG. 2, to protect the substrate support member 57.

Figure 4:
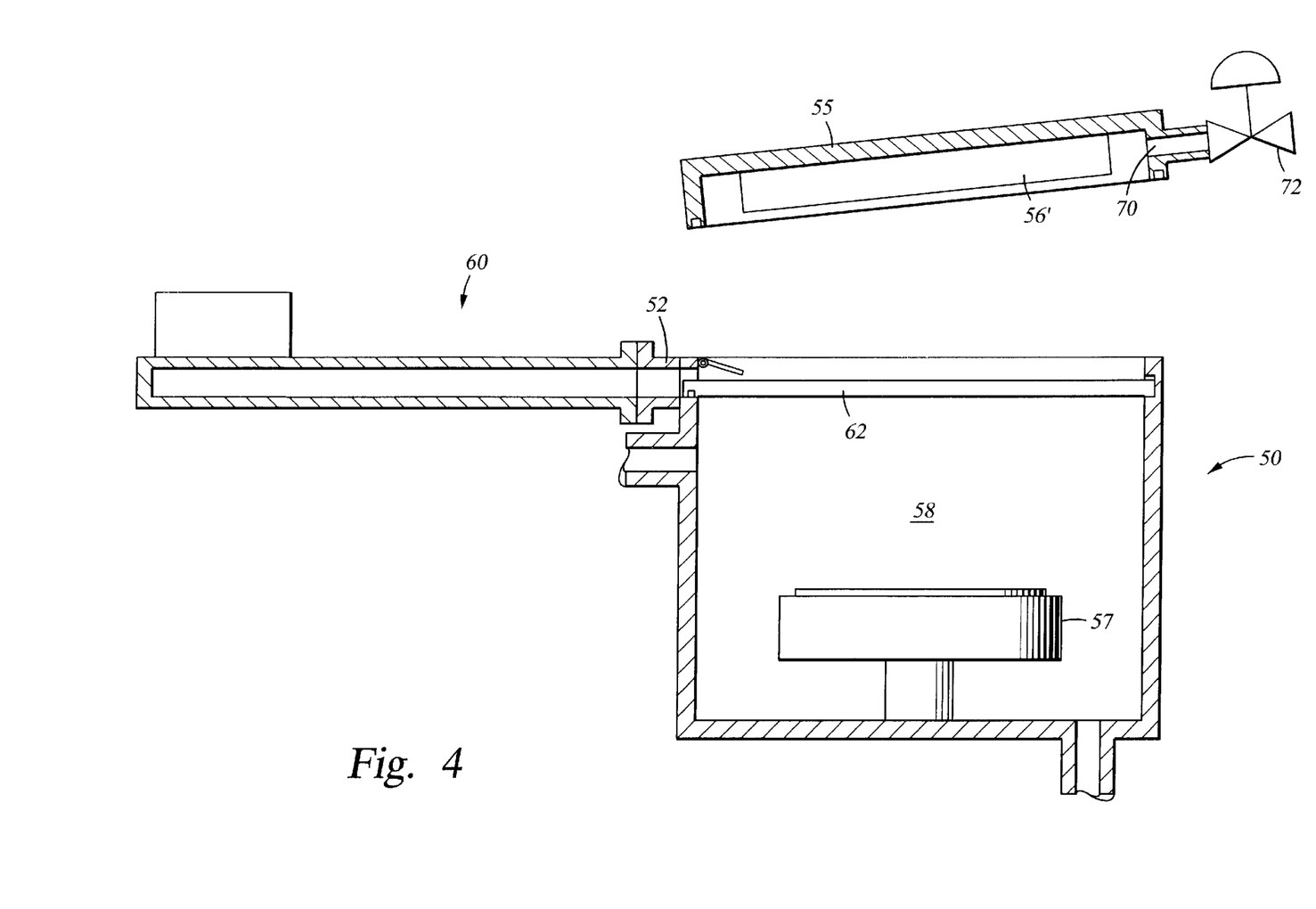

Now referring to FIG. 4, a simplified cross-sectional view of the PVD chamber 50 of FIG. 3 is shown having the lid 55 removed and a new sputter target 56' attached thereto. Note that the vacuum in the lower portion 58 of the chamber has not been disturbed.

Figure 5:
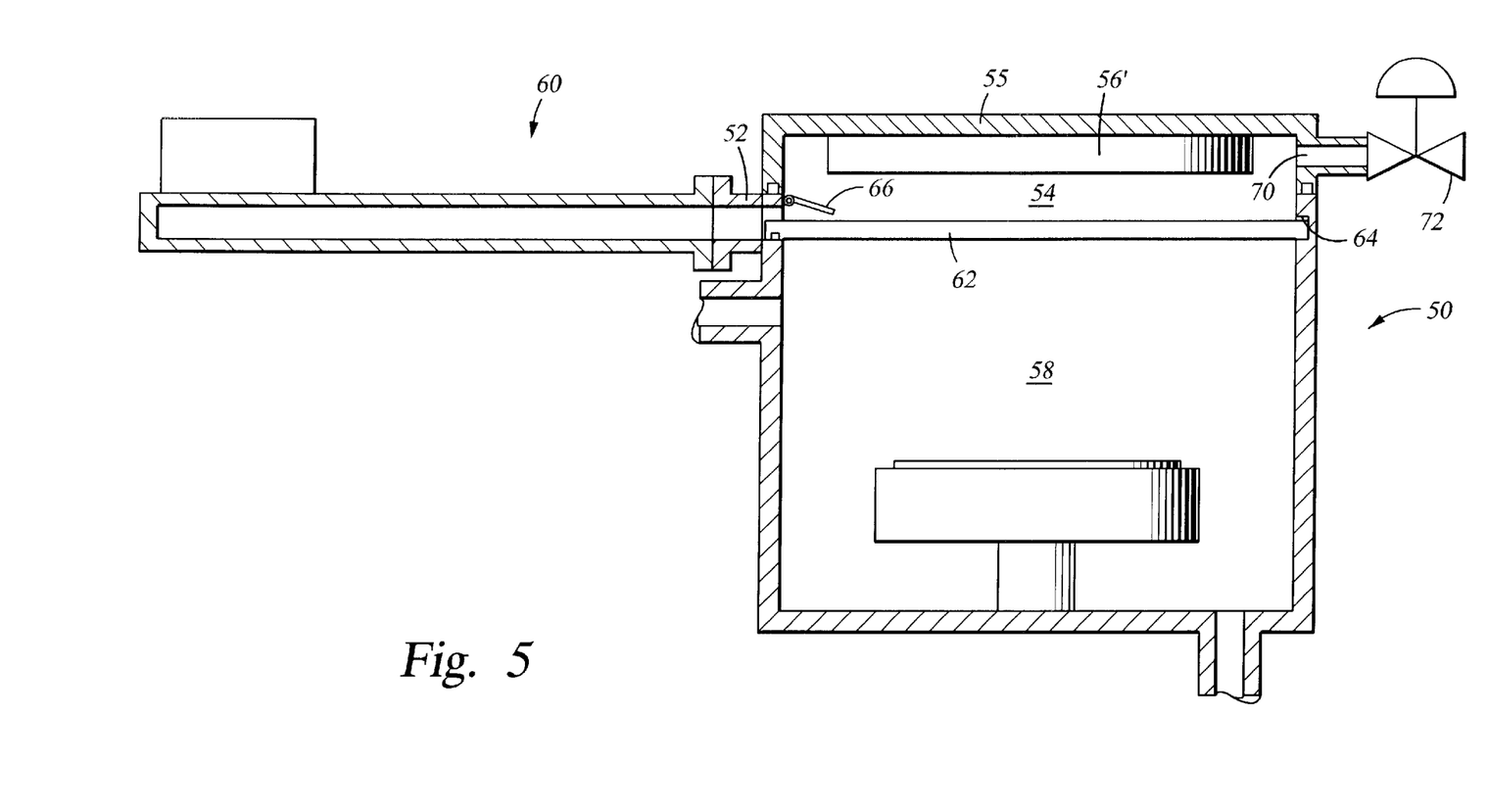
Figure 7:
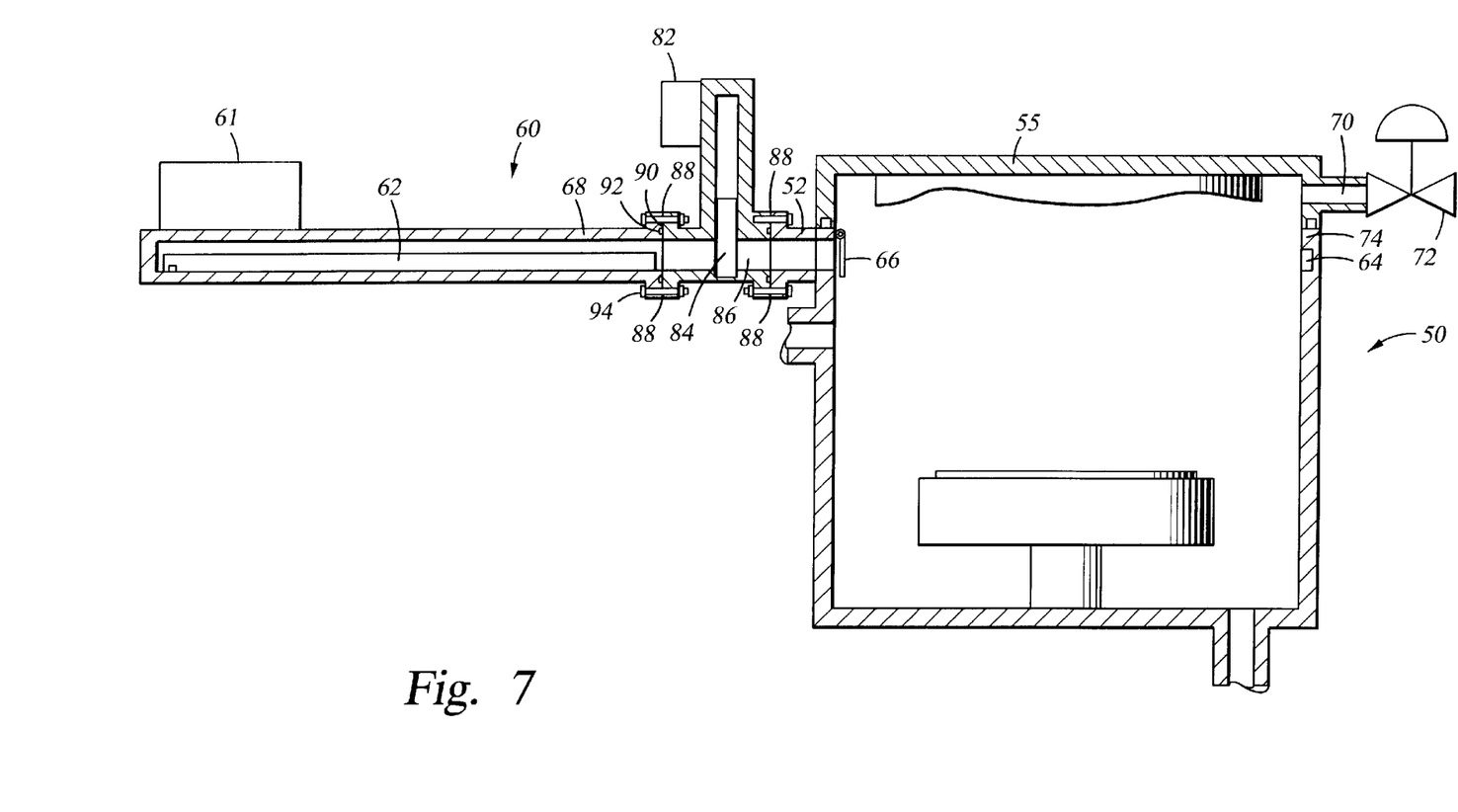
FIG. 7 is a simplified cross-sectional view of the PVD chamber of FIG. 1 having a secondary valve inserted between the isolation valve and valve port.

Whereas the gas port 70 to the first portion is shown in FIG. 4 to pass through the lid 55, it is only important that the gas port communicate with the first portion 54 when the lid is positioned on the chamber 50 (as shown in FIG. 5). More particularly, the gas port 70 may be incorporated in the side wall 74 of the chamber 50 above the valve seat 64 as shown in FIG. 7. Either configuration is operational and may be preferred in certain circumstances or arrangements of equipment adjacent the chamber.

Now referring to FIG. 5, a simplified cross-sectional view of the PVD chamber 50 of FIG. 4 is shown with the new sputter target 56' installed and the lid 55 repositioned. With the lid 55 back in place on the chamber, the vacuum in the first portion 54 may be re-established in a number of ways. First, the gas port valve 72 may be closed and the isolation valve 62 opened slowly to allow the gas from the first portion 54 to leak into the second portion 58 which remains under a vacuum. However, the unequal pressures on either side of the valve plate 62 may make the valve difficult to open or cause damage to the valve seat 64 or any associated gasketing. More preferably, the isolation valve 60 is not opened until a vacuum is drawn in the first portion 54 by connecting a vacuum to the gas port 70 and opening the gas port valve 72. The vacuum may be drawn in any manner available in the art, such as the combined use of a roughing pump and a cryogenic pump. It is anticipated that a vacuum manifold or other valve and piping arrangement may allow a single set of pumps to serve both the first portion 54 and second portion 58 of the chamber either alternately or in some combination.

Figure 6:
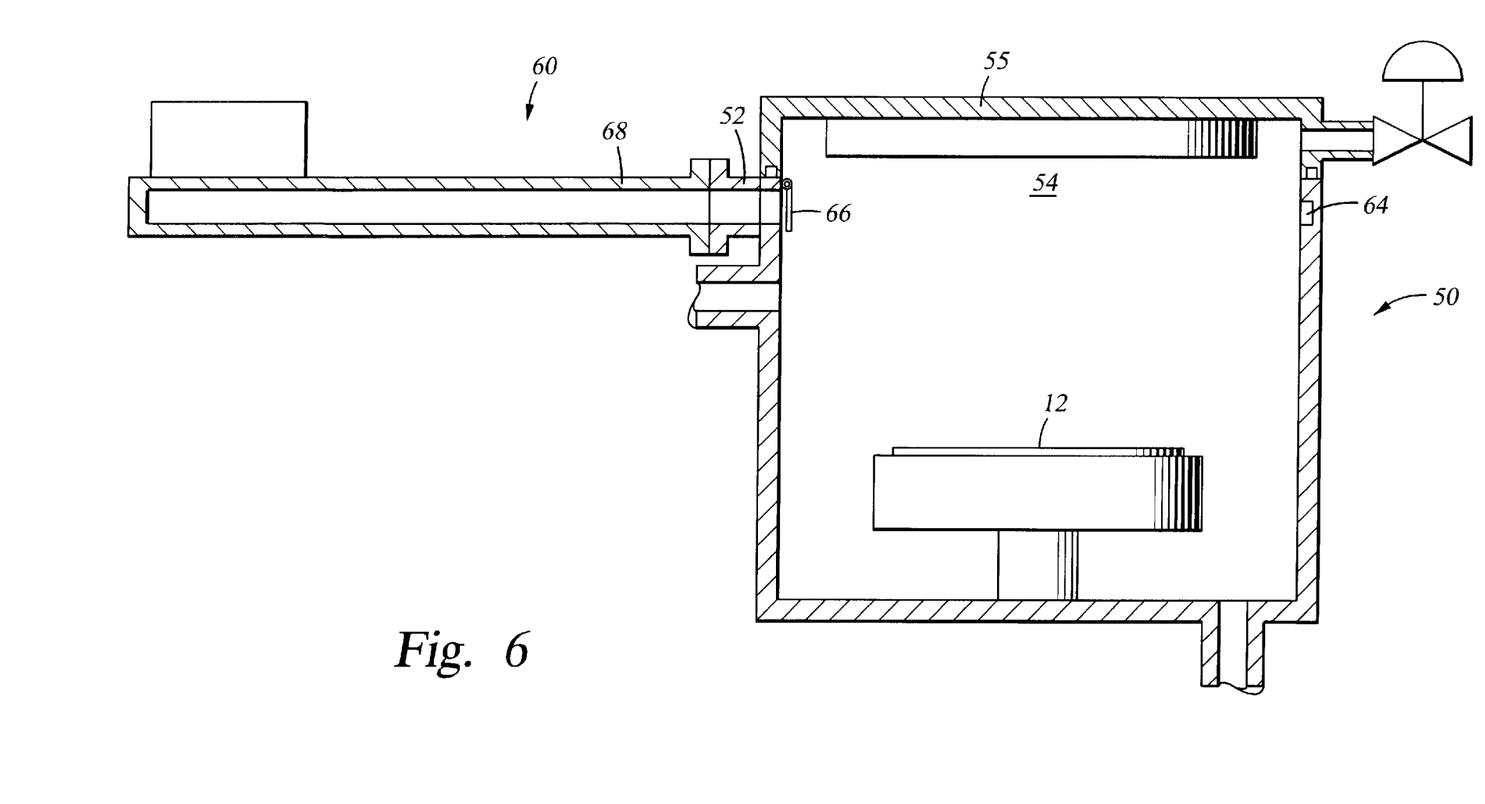

Now referring to FIG. 6, a simplified cross-sectional view of the PVD chamber of FIG. 5 is shown having the isolation valve plate 62 retracted into the valve housing 68 and the valve port shield 66 in a downward position to cover the valve port 52. Having completed the sequence of steps in FIGS. 2 through 6, the chamber 50 is once again ready for processing substrates 12.

Now referring to FIG. 7, a simplified cross-sectional view of the PVD chamber 50 of FIG. 1 is shown having a secondary valve 80 inserted between the isolation valve housing 68 and the valve port 52 to the chamber. Both the isolation valve 60 and secondary valve 80 are preferably gate type valves. In this configuration, the secondary valve 80 may be closed by the actuator 82 to protect the isolation valve 60 from the process environment, thereby allowing the isolation valve to serve multiple chambers. In operation, the secondary valve will normally have the plate 84 be closed to form a vacuum tight seal with the chamber 50. However, the secondary valve plate 84 must be opened prior to operating the actuator 61 of the isolation valve so that the isolation plate 62 may extend through the secondary valve opening 86 and into the chamber 50. It should be recognized that the presence of the secondary valve 80 means that the isolation valve plate or stem 62 must be elongated in order to reach therethrough.

While the vacuum-tight connections 88 between the valve port 52, the isolation valve 60 and, optionally, the secondary valve 80 may be established in any manner known in the art, the preferred connection is a machined flat surface 90 having an o-ring and retaining groove 92. As the vacuum in the chamber 50 is increased, the sealed connections 88 will become tighter and tighter. However, because the valves 60,80 may be extend from the side of the chamber, it will generally be necessary to provide a mechanical fastener 94 between these members. The fastener may be any known fastener, including bolts, hooks, clamps, springs, and the like. If a secondary valve 80 is incorporated and the isolation valve 60 is to be frequently detached, the preferred fastener is a quick connect/disconnect type, such as a clamp, hook or spring.

The chamber 50 described above may be used to advantage in replacing a process kit in a vacuum chamber, comprising the steps of: a) closing a vacuum-tight isolation valve to isolate a first portion of the chamber containing the process kit from a major portion of the chamber while under a vacuum; b) relieving the vacuum in the first portion of the chamber; c) opening a lid to the first portion of the chamber; d) replacing the previous process kit from the first portion of the chamber with a new process kit; e) closing the lid to the first portion of the chamber; f) drawing a vacuum in the first portion of the chamber; and g) opening the isolation valve. In a preferred method, the vacuum chamber is a physical vapor deposition chamber and the process kit includes a sputter target. It is further preferred that the major portion of the chamber contain the substrate support member.

While the foregoing is directed to the preferred embodiment of the present invention, other and further embodiments of the invention may be devised without departing from the basic scope thereof. The scope of the invention is determined by the claims which follow.

What is claimed is:

1. A physical vapor deposition chamber comprising:
   a lid portion containing a sputter target and a shield, a second portion containing a workpiece support member and a vacuum port, and a valve seat along the inner wall of the second portion, wherein the lid portion and the second portion form a vacuum tight enclosure;
   an isolation valve coupled to the second portion, the isolation valve having a housing, an isolation plate, and an actuator for displacing the isolation plate between a position fully retracted into the housing and a position fully extended into the second portion to sealingly engage the valve seat and form a vacuum tight seal with the second portion of the enclosure, whereby vacuum drawn in the enclosure is maintained in the second portion by extending the isolation valve before removing the lid portion.

2. The physical vapor deposition chamber of claim 1, wherein the isolation valve housing defines an isolation plate storage cavity, and wherein the chamber further comprises a secondary valve disposed between the isolation valve housing and the valve seat.

3. The physical vapor deposition chamber of claim 2, wherein the isolation valve is detachable from the secondary valve.

4. The physical vapor deposition chamber of claim 1, wherein the lid portion of the enclosure has a gas port and a vacuum controller.

5. A semiconductor manufacturing system, comprising:
   an enclosure having a first portion comprising a sputter target and a sputter shield, a second portion containing a workpiece support member and a vacuum port, an isolation valve seat along the inner wall of the enclosure between the first and second portions, and an isolation valve port along one portion of the isolation valve seat;
   a secondary valve positioned over the isolation valve port, wherein the secondary valve can seal the isolation valve port; and
   an isolation valve interchangeably coupled to the secondary valve, the isolation valve having an isolation plate, a housing that defines an isolation plate storage cavity, and an actuator for displacing the isolation plate between a position fully retracted into the housing and a position fully extended within the enclosure to sealingly engage the valve seat and form a vacuum tight seal with the second portion of the enclosure, whereby vacuum drawn in the enclosure is maintained in the second portion by extending the isolation valve before removing the lid portion.

6. The semiconductor manufacturing system of claim 5, wherein the enclosure is a physical vapor deposition chamber.

7. A method of replacing a sputter target and a sputter shield in a vacuum chamber, comprising:
   a) closing an isolation valve to isolate a lid portion of the chamber containing the sputter target and the sputter shield from a remaining portion of the chamber containing a substrate support member while under a vacuum;
   b) relieving the vacuum in the lid portion of the chamber;
   c) opening the lid portion of the chamber;
   d) replacing the sputter target and sputter shield from the lid portion of the chamber with a new sputter target and sputter shield;
   e) closing the lid portion of the chamber;
   f) drawing a vacuum in the lid portion of the chamber; and
   g) opening the isolation valve.

8. The method of claim 7, wherein the vacuum chamber is a physical vapor deposition chamber.

9. A physical vapor deposition chamber comprising:
   a lid portion, a second portion containing a workpiece support member and a vacuum port, and a valve seat along an inner wall of the second portion, wherein the lid portion and the second portion form a vacuum tight enclosure;

an isolation valve coupled to the second portion, the isolation valve having a housing, an isolation plate, and an actuator for displacing the isolation plate between a position fully retracted into the housing and a position fully extended into the second portion to sealingly engage the valve seat and form a vacuum tight seal with the second portion of the enclosure, whereby vacuum drawn in the enclosure is maintained in the second portion by extending the isolation valve before removing the lid portion; and a shield assembly having fixed upper and lower cylindrical shield members and a moveable shield member, wherein the upper shield member is coupled to the lid portion and the lower shield member is coupled to the inner wall a spaced distance apart from the upper shield to define a slot therebetween that is sufficient for passage of the isolation plate, and wherein the moveable shield member moves between a position covering the slot and a position uncovering the slot.

10. The physical vapor deposition chamber of claim 9, wherein the lid portion further comprises a sputter target.

11. The physical vapor deposition chamber of claim 9, wherein the isolation valve housing defines an isolation plate storage cavity, and wherein the chamber further comprises a secondary valve disposed between the isolation valve housing and the valve seat.

12. The physical vapor deposition chamber of claim 11, wherein the isolation valve is detachable from the secondary valve.

13. The physical vapor deposition chamber of claim 9, wherein the lid portion of the enclosure has a gas port and a vacuum controller.

\* \* \* \* \*